(12) United States Patent
Zha

(10) Patent No.: US 10,790,314 B2
(45) Date of Patent: Sep. 29, 2020

(54) DISPLAY PANEL AND DISPLAY DEVICE COMPRISING THE SAME

(71) Applicant: Wuhan China Star Optoelectronics Technology Co., Ltd., Wuhan, Hubei (CN)

(72) Inventor: Guowei Zha, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 57 days.

(21) Appl. No.: 15/740,449

(22) PCT Filed: Nov. 15, 2017

(86) PCT No.: PCT/CN2017/111042
§ 371 (c)(1),
(2) Date: Aug. 23, 2018

(87) PCT Pub. No.: WO2019/085026
PCT Pub. Date: May 9, 2019

(65) Prior Publication Data
US 2019/0386038 A1    Dec. 19, 2019

(51) Int. Cl.
| H01L 27/12 | (2006.01) |
| G02F 1/1333 | (2006.01) |
| G02F 1/1362 | (2006.01) |
| G02F 1/1368 | (2006.01) |
| H01L 27/32 | (2006.01) |
| H01L 51/00 | (2006.01) |

(52) U.S. Cl.
CPC ........ *H01L 27/1244* (2013.01); *G02F 1/1368* (2013.01); *G02F 1/133305* (2013.01); *G02F 1/136209* (2013.01); *G02F 1/136286* (2013.01); *H01L 27/3272* (2013.01); *H01L 27/3276* (2013.01); *H01L 51/0097* (2013.01); *G02F 2001/13685* (2013.01)

(58) Field of Classification Search
None
See application file for complete search history.

(56) References Cited

U.S. PATENT DOCUMENTS

| 2014/0299884 A1 | 10/2014 | Park et al. |
| 2015/0227248 A1 | 8/2015 | Yamazaki et al. |
| 2016/0037609 A1 | 2/2016 | Ka et al. |

(Continued)

FOREIGN PATENT DOCUMENTS

| CN | 104157246 A | 11/2014 |
| CN | 104701342 | 6/2015 |
| CN | 105513501 | 4/2016 |

(Continued)

*Primary Examiner* — Jack S Chen
(74) *Attorney, Agent, or Firm* — Hemisphere Law, PLLC; Zhigang Ma

(57) ABSTRACT

A display panel and a display device comprising the same are provided. The display panel includes a planar substrate and a boundary substrate formed by bending the boundary of the planar substrate; and scan lines arranged on the planar substrate and extended to the boundary substrate. The width of the scan line on the bended position of the planar substrate is larger than the width of the remaining scan line.

13 Claims, 2 Drawing Sheets

(56) References Cited

U.S. PATENT DOCUMENTS

2018/0040680 A1* 2/2018 Cai .................. G09G 3/20

FOREIGN PATENT DOCUMENTS

| CN | 105976718 | 9/2016 |
| CN | 106205394 | 12/2016 |
| CN | 106340250 A | 1/2017 |
| CN | 107293570 | 10/2017 |

* cited by examiner

DISPLAY PANEL AND DISPLAY DEVICE COMPRISING THE SAME

RELATED APPLICATIONS

The present application is a National Phase of International Application Number PCT/CN2017/111042, filed Nov. 15, 2017, and claims the priority of China Application No. 201711054067.3, filed Oct. 31, 2017.

FIELD OF THE DISCLOSURE

The disclosure relates to a display technical field, and more particularly to a display panel and a display device comprising the same.

BACKGROUND

With the development of wearable devices such as smart glasses and smart watches, the demands for flexible displays endlessly increase in the display technology. Organic light emitting diode (OLED) displays not only emit light without backlight modules, but also have advantages of thin thickness, wide visual angle, fast response speed, and flexibility. In order to face the competition of flexible OLED displays, the conventional liquid-crystal display technology gradually uses flexible and curved substrates. As a result, the era of flexible and curved displays are drawing closer.

Presently, the latest flexible display technology stays in the era of curved displays. The boundary of a small-size display has a cambered display area with a fixed radius of curvature to visually provide a larger full screen. However, the radius of curvature is too large, and the display makes much of appearance rather than practical functions. The problem to be solved is related to the reliability of light and electrical signals for a curved screen with a small radius of curvature. Due to a small radius of curvature, the boundary of a display area of a display device is bended by about 90 degrees, thereby forming a full screen display device. Besides, the bended display area is arranged at the side of the display device. The control icons of power, volume, photographing, brightness adjustment, and application program (APP) on the bended display area can improve the applicability of the display device, especially for hand-held display devices.

Owning to a flexible substrate, the conventional planar display is flexible and the curved display is hardened. However, the reliability of scan lines on bended or folded regions of a display device should be considered since the regions have larger stresses. Especially, the electrical properties of the scan lines are concerned. As a result, the related solution is urgently needed.

SUMMARY

A technical problem to be solved by the disclosure is to provide a display panel and a display device comprising the same to improve the electrical reliability.

An objective of the disclosure is achieved by following embodiments. In particular, the display panel includes a planar substrate and a boundary substrate formed by bending a boundary of the planar substrate; and scan lines arranged on the planar substrate and extended to the boundary substrate, and a width of the scan line on a bended position of the planar substrate is larger than a width of the remaining scan line.

In an embodiment of the present invention, the display panel further comprises first pixels arranged into an array of M×N on the planar substrate; and second pixels arranged into an array of M×Q on the boundary substrate, and M, N, and Q are positive integers, the N-th column of the first pixels and the first column of the second pixels are respectively arranged at two sides of the bended position, and a width of the second pixels in a row direction is larger than a width of from the first column to the (N−1)th column of the first pixels in a row direction, and a width of the N-th column of the first pixels in a row direction is larger than the width of from the first column to the (N−1)th column of the first pixels in a row direction, In an embodiment of the present invention, the width of the N-th column of the first pixels in a row direction is equal to the width of the second pixels in a row direction.

In an embodiment of the present invention, the display panel further comprises N first data lines and Q second data lines, and the i-th column of the first pixels is correspondingly connected to the i-th first data line, and the j-th column of the second pixels is correspondingly connected to the j-th second data line, and 1≤i≤N, and 1≤j≤Q.

In an embodiment of the present invention, the N-th first data line connected to the N-th column of the first pixels is arranged at a side of the N-th column of the first pixels far away from the bended position of the planar substrate.

In an embodiment of the present invention, the first second data line connected to the first column of the second pixels is arranged at a side of the first column of the second pixels far away from the bended position of the planar substrate.

In an embodiment of the present invention, when the display panel operates, the first pixels and the second pixels have identical storage voltages.

In an embodiment of the present invention, the display panel further comprises lightshielding structures arranged over the bended position of the planar substrate where the scan lines are located.

In an embodiment of the present invention, the display panel is a liquid crystal display panel or an organic light emitting diode (OLED) display panel.

In an embodiment of the present invention, a display device comprising the display panel is provided.

The present invention widens the scan lines on the bended position to improve the electrical reliability of the scan lines on the bended position. Besides, the display panel is bended by a radius of small curvature of 90 degrees. The control icons of power, volume, photographing, brightness adjustment, and application program (APP) are shown on the boundary display area to perform a full-screen display function, thereby achieving the practicability and beautifying the appearance of the display panel.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
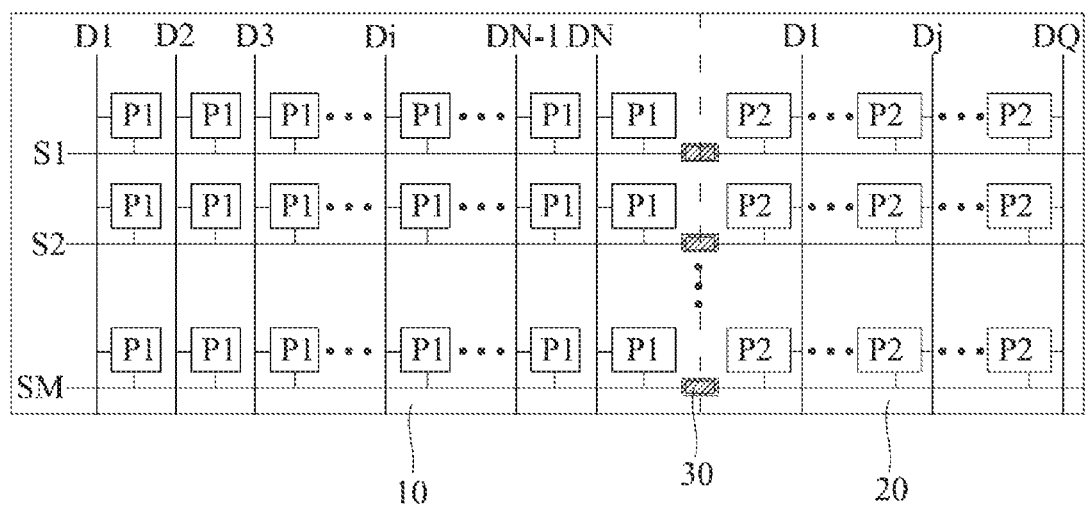
FIG. 1 is a schematic view of a display panel before bending the display panel according to an embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

Wherever possible, the same reference numbers are used in the drawings and the description to refer to the same or like parts. In the drawings, the shape and thickness may be exaggerated for clarity and convenience.

Figure 2:
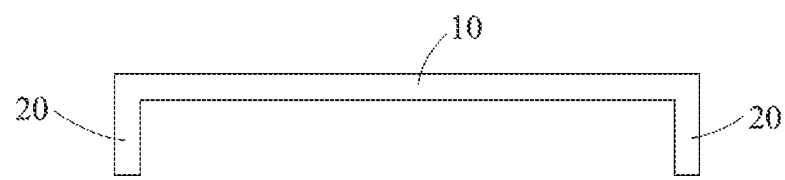
FIG. 2 is a structural schematic view of a display panel after bending the display panel according to an embodiment of the disclosure.

FIG. 1 is a schematic view of a display panel before bending the display panel according to an embodiment of the disclosure. FIG. 2 is a structural schematic view of a display panel after bending the display panel according to an embodiment of the disclosure.

Refer to FIG. 1 and FIG. 2. According to an embodiment of the present invention, the display panel comprises first pixels P1 arranged into an array of M×N, second pixels P2 arranged into an array of M×Q, M scan lines S1, S2, . . . , SM, N first data lines D1, D2, . . . , DN, Q second data lines D1, D2, . . . , DQ, a planar substrate 10, a boundary substrate 20, and light-shielding structures 30, wherein M, N, and Q are positive integers. It is noted that the display panel further comprises other necessary elements.

The display panel may be a liquid crystal display panel or an organic light emitting diode (OLED) display panel, but the present invention is not limited thereto.

Although two numbers are respectively represent the planar substrate and the boundary substrate, the planar substrate and the boundary substrate belong to one substrate before bending the boundary substrate. Two numbers are used to distinguish the planar substrate from the boundary substrate and conveniently explain them. In general, the boundary substrate 20 is the boundary of the planar substrate 10. A dashed line in FIG. 1 represents a bended line (bended position), but the dashed line does not exist practically. The substrate is bended along the bended line, such that the planar substrate 10 is vertical (90 degrees) to the boundary substrate to form a curved full screen. Certainly, it is explained that the substrate is bended by another angle. In addition, FIG. 1 shows that a side of the planar substrate 10 is bended, but the present invention is not limited thereto. Alternatively, two, three, or four sides of the planar substrate may be bended according to requirements. FIG. 2 shows that the boundaries at two opposite sides of the planar substrate 10 are bended.

The first pixels P1 are arranged into an array of M×N on the planar substrate 10, and the second pixels P2 arranged into an array of M×Q on the boundary substrate 20.

Each scan line is arranged under its corresponding row of the first pixels P1 and the second pixels P2, but the present invention is not limited thereto. That is to say, each scan line is arranged on the planar substrate 10 and extended to the boundary substrate 20. Thus, each scan line traverses the bended position. In order to prevent the scan line on the bended position from breaking, each scan line on the bended position is widened to improve the antibreak abilities and reliability of the scan line.

After widening the scan lines on the bended position, the light-shielding structures 30 are arranged over the widened parts of the scan lines. The light-shielding structures 30 may be a black matrix of the display panel, but the present invention is not limited thereto. The light-shielding structures 30 are used to prevent environmental light from passing through the widened scan lines to be reflected and affecting the display effect. The width of the light-shielding structure 30 may be 10-100 μm. Specifically, the width of the light-shielding structure 30 depends on a radius of curvature of the bended position. The radius of smaller curvature usually represents a narrower width.

Each first data line is arranged on the planar substrate 10 and extended in a column direction, and each second data line is arranged on the boundary substrate 20 and extended in a column direction. Furthermore, the i-th column of the first pixels P1 is correspondingly connected to the i-th first data line Di, and the j-th column of the second pixels P2 is correspondingly connected to the j-th second data line Dj, and $1 \leq i \leq N$, and $1 \leq j \leq Q$.

The N-th first data line DN connected to the N-th column of the first pixels P1 is arranged at a side of the N-th column of the first pixels P1 far away from the bended position of the planar substrate 10. The first second data line D1 connected to the first column of the second pixels P2 is arranged at a side of the first column of the second pixels P2 far away from the bended position of the planar substrate 10. Since each pixel has a thin film transistor (not shown), the thin film transistor is correspondingly connected to the scan line and the data line. Since the N-th first data line DN and the first second data line D1 are arranged far away from the bended position, the thin film transistor is also arranged far away from the bended position, lest the thin film transistor on the bended position be abnormally driven.

Besides, the N-th column of the first pixels P1 and the first column of the second pixels P2 are respectively arranged at two sides of the bended position, and the width of the second pixels P2 in a row direction is larger than the width of from the first column to the (N−1)th column of the first pixels P1 in a row direction, and the width of the N-th column of the first pixels P1 in a row direction is larger than the width of from the first column to the (N−1)th column of the first pixels P1 in a row direction. In this way, the display resolution of the boundary substrate 20 is lower than that of the planar substrate 10, such that the number of the data lines and the driving abilities of a data driver are reduced to decrease the fabrication cost. In addition, the display ability of the boundary substrate 20 is required to differ from the display ability of the planar substrate 10. The display area of the boundary substrate 20 only displays control icons of power, volume, photographing, brightness adjustment, and application program (APP). Thus, the display resolution of the boundary substrate 20 is not strictly required.

The width of the N-th column of the first pixels P1 in a row direction is equal to the width of the second pixels P2 in a row direction. In other words, the pixels with only two sizes are fabricated to save the fabrication procedures.

On top of that, when the display panel operates, the first pixels P1 and the second pixels P2 have identical storage voltages. In this way, when the display panel is a liquid crystal display panel or an organic light emitting diode (OLED) display panel, the display panel possesses the same brightness.

Figure 3:
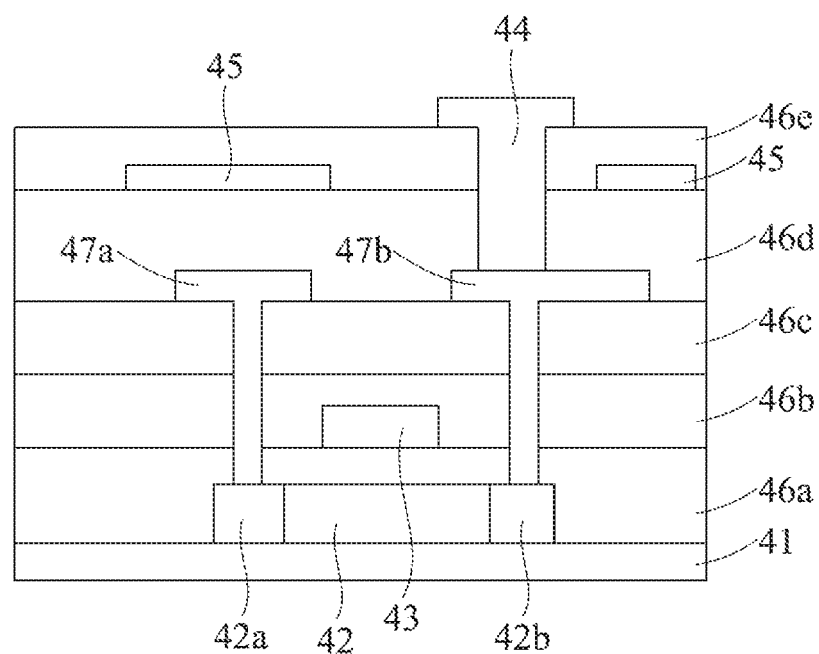
FIG. 3 is a structural schematic view of a thin film transistor of each pixel according to an embodiment of the disclosure.

The structure of a thin film transistor of each pixel is briefly introduced as follows. FIG. 3 is a structural schematic view of a thin film transistor of each pixel according to an embodiment of the disclosure.

Refer to FIG. 3. According to an embodiment of the present invention, the thin film transistor of each pixel comprises a substrate 41, an active layer 42, a gate 43, a source 42a, a drain 42b, a pixel electrode 44, a common electrode 45, and insulation layers.

The active layer 42 is formed on the substrate 41. The source 42a and the drain 42b are formed at two sides of the active layer 42. The active layer 42 is covered with a first insulation layer 46a. The gate 43 is formed on the first insulation layer 46a. The gate 43 and the first insulation layer 46a are covered with a second insulation layer 46b and a third insulation layer 46c. The first insulation layer 46a, the second insulation layer 46b, and the third insulation layer 46c are penetrated with metal contact electrodes 47a and 47b that are formed on the third insulation layer 46c, The metal contact electrode 47a touches the source 42a, and the metal contact electrodes 47b touches the drain 42b. A flat layer (insulated) 46d is formed on the metal contact electrodes 47a and 47b. The common electrode 45 is formed on the flat layer. A separation layer (insulated) 46e is formed on the common electrode 45 and the flat layer 46d. The pixel electrode 44 is formed on the separation layer 46e, The pixel electrode 44 penetrates through the separation layer 46e and the flat layer 46d and touches the metal contact electrodes 47b.

In conclusion, the present invention widens the scan lines on the bended position to improve the antibreak abilities and the electrical reliability of the scan lines on the bended position. Besides, the display panel is bended by a radius of small curvature of 90 degrees. The control icons of power, volume, photographing, brightness adjustment, and application program (APP) are shown on the boundary display area to perform a full-screen display function, thereby achieving the practicability and beautifying the appearance of the display panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A display panel, comprising
a planar substrate and a boundary substrate formed by bending a boundary of the planar substrate;
scan lines arranged on the planar substrate and extended to the boundary substrate, and a width of the scan line on a bended position of the planar substrate is larger than a width of remaining the scan line; and
first pixels arranged into an array of M×N on the planar substrate, and second pixels arranged into an array of M×Q on the boundary substrate;
wherein M, N, and Q are positive integers, an N-th column of the first pixels and a first column of the second pixels are respectively arranged at two sides of the bended position, and a width of all of the second pixels in a row direction is larger than a width of the first pixels located from a first column to an (N-1)th column in a row direction, and a width of the first pixels located on an N-th column in a row direction is larger than the width of the first pixels located from the first column to the (N-1)th column in a row direction.

2. The display panel according to claim 1, wherein the width of the N-th column of the first pixels in a row direction is equal to the width of the second pixels in a row direction.

3. The display panel according to claim 2, further comprising N first data lines and Q second data lines, and an i-th column of the first pixels is correspondingly connected to i-th the first data line, and a j-th column of the second pixels is correspondingly connected to j-th the second data line, and 1≤i≤N, and 1≤j≤Q.

4. The display panel according to claim 3, wherein N-th the first data line connected to an N-th column of the first pixels is arranged at a side of the N-th column of the first pixels far away from the bended position of the planar substrate.

5. The display panel according to claim 3, wherein first the second data line connected to a first column of the second pixels is arranged at a side of the first column of the second pixels far away from the bended position of the planar substrate.

6. The display panel according to claim 2, wherein first the second data line connected to a first column of the second pixels is arranged at a side of the first column of the second pixels far away from the bended position of the planar substrate.

7. The display panel according to claim 1, further comprising N first data lines and Q second data lines, and an i-th column of the first pixels is correspondingly connected to i-th the first data line, and a j-th column of the second pixels is correspondingly connected to j-th the second data line, and 1≤i≤N, and 1≤j≤W.

8. The display panel according to claim 7, wherein N-th the first data line connected to an N-th column of the first pixels is arranged at a side of the N-th column of the first pixels far away from the bended position of the planar substrate.

9. The display panel according to claim 7, wherein first the second data line connected to a first column of the second pixels is arranged at a side of the first column of the second pixels far away from the bended position of the planar substrate.

10. The display panel according to claim 1, wherein when the display panel operates, the first pixels and the second pixels have identical storage voltages.

11. The display panel according to claim 1, further comprising light-shielding structures arranged over the bended position of the planar substrate where the scan lines are located.

12. The display panel according to claim 1, wherein the display panel is a liquid crystal display panel or an organic light emitting diode (OLED) display panel.

13. A display device comprising the display panel of claim 1.

* * * * *